United States Patent
Keckes et al.

(10) Patent No.: US 10,205,035 B2
(45) Date of Patent: Feb. 12, 2019

(54) PROXIMITY SENSOR

(75) Inventors: Antal Keckes, Gottmadingen (DE); Peter Schuler, Nagold (DE); Thomas Hermann, Stetten a.k.M. (DE)

(73) Assignee: OERLIKON SURFACE SOLUTIONS AG, PFÄFFIKON, Pfäffikon SZ (CH)

( * ) Notice: Subject to any disclaimer, the term of this patent is extended or adjusted under 35 U.S.C. 154(b) by 650 days.

(21) Appl. No.: 14/007,740

(22) PCT Filed: Mar. 2, 2012

(86) PCT No.: PCT/EP2012/000927
§ 371 (c)(1),
(2), (4) Date: Jan. 2, 2014

(87) PCT Pub. No.: WO2012/130372
PCT Pub. Date: Oct. 4, 2012

(65) Prior Publication Data
US 2014/0183678 A1    Jul. 3, 2014

Related U.S. Application Data

(60) Provisional application No. 61/470,571, filed on Apr. 1, 2011.

(30) Foreign Application Priority Data

Apr. 20, 2011 (DE) .................. 10 2011 018 364

(51) Int. Cl.
*H01L 31/18* (2006.01)
*H03K 17/955* (2006.01)
*H01L 31/0203* (2014.01)

(52) U.S. Cl.
CPC .......... *H01L 31/0203* (2013.01); *H01L 31/18* (2013.01); *H03K 17/955* (2013.01); *H03K 2217/960755* (2013.01)

(58) Field of Classification Search
CPC ... H01L 31/18; H01L 31/0203; H03K 17/955; H03K 2217/960755
(Continued)

(56) References Cited

U.S. PATENT DOCUMENTS

| 6,189,835 B1 * | 2/2001 | Kaufman | B64G 1/24 |
| | | | 244/158.1 |
| 2003/0006516 A1 * | 1/2003 | Berneth | C07D 217/14 |
| | | | 264/1.33 |

(Continued)

FOREIGN PATENT DOCUMENTS

| DE | 27 44 785 A1 | 4/1979 |
| EP | 2 233 840 A1 | 9/2010 |

(Continued)

OTHER PUBLICATIONS

International Search Report for PCT/EP2012/000927 dated Jun. 13, 2012.

*Primary Examiner* — Galina Yushina
(74) *Attorney, Agent, or Firm* — Pearne & Gordon LLP

(57) ABSTRACT

The present invention relates to an electronic proximity sensor having a decorative surface, characterized in that the decorative surface comprises a semiconductor layer, the thickness of which is between 10 nm and 100 nm. This coating imparts a desired metallic appearance to the proximity sensor, without the property thereof as a proximity sensor being lost.

12 Claims, 1 Drawing Sheet

| 16 |
|---|
| 14 |
| 12 |
| 10 |

| 16 |
|---|
| 18 |
| 14 |
| 12 |
| 10 |

(58) Field of Classification Search
USPC .................................................. 438/104, 57
See application file for complete search history.

(56) References Cited

U.S. PATENT DOCUMENTS

| | | | |
|---|---|---|---|
| 2005/0274988 A1* | 12/2005 | Hong ................ | H01L 27/14625 |
| | | | 257/225 |
| 2006/0105196 A1* | 5/2006 | Roth ...................... | B64G 1/226 |
| | | | 428/688 |
| 2008/0211519 A1* | 9/2008 | Kurumado ............... | G01D 5/24 |
| | | | 324/688 |
| 2010/0321758 A1* | 12/2010 | Bugno et al. ................. | 359/267 |
| 2011/0273356 A1* | 11/2011 | Kawaguchi ......... | C23C 14/0015 |
| | | | 343/873 |
| 2012/0161795 A1* | 6/2012 | Pfau .................... | H03K 17/962 |
| | | | 324/679 |

FOREIGN PATENT DOCUMENTS

| | | |
|---|---|---|
| GB | 2 005 422 A | 4/1979 |
| WO | 2010/084733 A1 | 7/2010 |

* cited by examiner

| 16 |
|---|
| 14 |
| 12 |
| 10 |

FIG. 1

| 16 |
|---|
| 18 |
| 14 |
| 12 |
| 10 |

FIG. 2

| 16 |
|---|
| 18 |
| 20 |
| 12 |
| 10 |

FIG. 3

PROXIMITY SENSOR

The present invention relates to an electronic proximity sensor.

Electronic proximity sensors with electric or electronic circuits that can be influenced capacitively from outside, such as for example oscillators, have been known for a long time (see DE 2744785). Generally speaking, by moving an object close to the surface of the sensor, the capacitance of at least one element of the circuit is changed. This causes changes in the electric behavior of the circuit. For example, in an oscillating circuit, the frequency can be changed. Such a change of frequency can be detected and interpreted as a switching signal.

In particular, the modern automotive industry increasingly makes use of multifunctional surfaces that can also be used as sensor surfaces. The trend in this respect is moving away from classical switches or pushbuttons for controlling functions towards sensor elements that are directly integrated into synthetic surfaces. The latter can, as described by way of example above, detect by means of capacitive evaluation whether a finger is moving closer to the sensor surface and thus whether switching functions roust be executed. The relevant technology of sensor query is well known and also technically developed.

The sensor elements in such cases lie below the decorative surfaces and can thus quite easily be integrated for example in the synthetic surfaces of an automobile interior. A considerable problem is however currently that the decorative surfaces over the sensor-active surfaces should mostly have a metallic appearance.

The metallic coating of synthetic surfaces is a known technique that however has the great disadvantage of the metallic coatings in the surface being conductive and thus, under the decorative surface, of capacitive sensing of the signal being no longer possible.

The problem can thus be described as follows: on the one hand, there is a request for synthetic surfaces with a metallic gloss, which on the other hand do not shield the capacitive sensors lying underneath. The nature of the problem poses particular challenges in that the metallic surfaces are characterized both by their degree of gloss and by their shade of color (CIE lab values).

It is thus the aim of the present invention to overcome or at least alleviate the problem described above.

According to the invention, the aim is achieved in that the decorative surface of a capacitive proximity sensor is coated with a thin semiconductor layer, the thickness of which is preferably between 10 nm and 100 nm. Silicon is particularly suited for this purpose. This coating can be applied by means of physical vapor deposition (PVD). Tightness, and thus preferred layers, can be achieved by means of a magnetron sputtering process.

The invention will now be described in more detail on the basis of examples.

According to a first embodiment of the present invention, as shown in FIG. 1, a silicon layer 14 with a thickness of 35 nm (i.e. within the 10 nm to 100 nm thickness range) is deposited as semiconductor layer onto the surface of a capacitive proximity sensor 10. In order to smooth any potential surface structures, a primer (UV acryl lacquer) 12 is first applied onto the surface. After applying the Si-layer 14 by means of magnetron sputtering, a top layer (UV acryl lacquer) 16 is applied in the present example for additional protection of the thin Si-layer 14. This results in a bluish to yellowish metallically shimmering surface. Thanks to the low electric conductivity of silicon, the sensor 10 is not shielded electrically resp. capacitively.

According to a second embodiment of the present invention, as shown in FIG. 2, the semiconductor layer is executed as a layer system. This can for example be structured as alternating layer system with a semiconductor, e.g. Si 14 and a dielectric 18, e.g. $SiO_2$. The total thickness of the Si-layers should in this case again be in the range between 10 nm and 100 nm. In order to achieve the desired transmission and reflection characteristic in the visible range of the spectrum of electromagnetic rays, performance-enhanced optimization programs for optical thin-films are nowadays available to the one skilled in the art. A more in-depth explanation in this respect is therefore eschewed in the present case.

According to a third embodiment of the present invention, as shown in FIG. 3, Germanium is used as semiconductor material for the coating. This coating can also be executed as an individual thin germanium monolayer 20 with a thickness of 10 nm to 100 nm or as an alternating layer system with one or several dielectrics 18, such as for example $SiO_2$. In particular, Ge can also be combined with Si in order to achieve the desired effects.

The three embodiments have been described in the present case with primer. Such a lacquer layer, which is placed between the PVD layer and the substrate, can be called a basecoat. If desired, it is possible to do without this basecoat.

An electronic proximity sensor with a sensor element placed below a decorative surface has been described, whose decorative surface is coated with a thin semiconductor layer. In the frame of this description, a semiconductor layer designates a layer comprising at least one semiconductor. The semiconductor layer preferably has a thickness between 10 nm and 100 nm. Preferably, the semiconductor layer comprises silicon as semiconductor material. Even more preferably, the semiconductor layer consists of silicon.

The semiconductor layer can be a component of a layer system comprising at least one further layer, which is preferably an interference layer system. The at least one other layer can be a $SiO_2$ layer. The layer system can preferably be an alternating layer system. Between the component forming the decorative surface and the semiconductor layer, it is possible to provide an intermediary layer comprising a polymer layer that preferably consists of a UV-hardened lacquer. It is possible to provide as a sealing layer against the environment a polymer coating, which preferably consists of a UV-hardened lacquer. The electronic proximity sensor can constitute a proximity circuit.

A method for producing an electronic proximity sensor has been described, having the steps of:
providing an electronic proximity sensor having a decorative surface
coating the decorative surface with a semiconductor layer, the thickness of which is between 10 nm and 100 nm, wherein the coating is achieved by means of a vacuum process. The vacuum process is preferably a PVD and/or a MID process.

What is claimed is:

1. Method for producing an electronic proximity sensor, having the steps of:
providing a capacitive proximity sensor having a sensor surface, and
coating the sensor surface with a semiconductor layer, the thickness of which is between 10 nm and 100 nm, wherein the coating is achieved by a vacuum process,
wherein the semiconductor layer is a silicon layer or a germanium layer or a layer consisting of silicon and germanium, and wherein the electronic proximity sensor has a decorative surface with a metallic appearance.

2. The method according to claim 1, characterized in that the vacuum process comprises at least one of PVD and CVD process.

3. The method of claim 1, wherein the semiconductor layer is a layer component of a layer system.

4. The method of claim 1, wherein the semiconductor layer is a layer component of a layer system and the layer system is structured as alternating layer system comprising at least one semiconductor layer and one dielectric layer.

5. The method of claim 4, wherein the semiconductor layer is a Si-layer and the dielectric layer is a $SiO_2$-layer.

6. The method of claim 4, wherein the semiconductor layer comprises germanium and the dielectric layer is a $SiO_2$-layer.

7. The method of claim 1, wherein a primer of UV acryl lacquer is first applied onto the surface.

8. The method of claim 1, wherein a top layer of UV acryl lacquer is applied.

9. The method of claim 2, wherein the vacuum process includes or is magnetron sputtering.

10. The method of claim 6, wherein germanium and silicon oxide are alternately formed.

11. The method of claim 4, wherein the one semiconductor layer comprises silicon and germanium combined, and the one dielectric layer comprises silicon oxide.

12. The method of claim 1, wherein the decorative surface comprises an entire decorative surface.

\* \* \* \* \*

UNITED STATES PATENT AND TRADEMARK OFFICE
CERTIFICATE OF CORRECTION

PATENT NO. : 10,205,035 B2
APPLICATION NO. : 14/007740
DATED : February 12, 2019
INVENTOR(S) : Antal Keckes et al.

It is certified that error appears in the above-identified patent and that said Letters Patent is hereby corrected as shown below:

In the Specification

Column 2, Line 56, "MID" should be -- CVD --.

Signed and Sealed this
Thirtieth Day of April, 2019

Andrei Iancu
*Director of the United States Patent and Trademark Office*